United States Patent
Kim et al.

(10) Patent No.: US 10,062,317 B2
(45) Date of Patent: Aug. 28, 2018

(54) PANEL ARRAY FOR DISPLAY DEVICE WITH NARROW BEZEL

(71) Applicant: LG DISPLAY CO., LTD., Seoul (KR)

(72) Inventors: Wondoo Kim, Paju-si (KR); Euihyun Chung, Goyang-si (KR); Hun Jang, Paju-si (KR); Cheolhwan Lee, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 154 days.

(21) Appl. No.: 14/869,250

(22) Filed: Sep. 29, 2015

(65) Prior Publication Data

US 2016/0111040 A1  Apr. 21, 2016

(30) Foreign Application Priority Data

Oct. 16, 2014  (KR) ........................ 10-2014-0139938

(51) Int. Cl.
| | |
|---|---|
| *G09G 3/20* | (2006.01) |
| *H01L 27/12* | (2006.01) |
| *G02F 1/1345* | (2006.01) |
| *G02F 1/1333* | (2006.01) |
| *G06F 1/16* | (2006.01) |
| *G09G 3/36* | (2006.01) |
| *G09G 3/18* | (2006.01) |
| *H01L 51/52* | (2006.01) |

(52) U.S. Cl.
CPC ....... *G09G 3/2096* (2013.01); *G02F 1/13454* (2013.01); *H01L 27/124* (2013.01); *G09G 3/20* (2013.01); *G09G 3/3677* (2013.01); *G09G 2300/0426* (2013.01); *G09G 2310/0281* (2013.01)

(58) Field of Classification Search
CPC ... G06F 3/041; G02B 6/0088; G02F 1/13336; G09G 3/3648
See application file for complete search history.

(56) References Cited

U.S. PATENT DOCUMENTS

| | | | | |
|---|---|---|---|---|
| 2004/0212555 | A1* | 10/2004 | Falco | G06F 1/1626 345/50 |
| 2005/0225690 | A1* | 10/2005 | Battersby | G02F 1/13336 349/41 |
| 2010/0156945 | A1* | 6/2010 | Yoshida | G02F 1/1345 345/690 |
| 2012/0194773 | A1* | 8/2012 | Kim | G02F 1/13336 349/139 |
| 2014/0042000 | A1* | 2/2014 | Iwasaki | G06F 3/041 200/293 |

(Continued)

*Primary Examiner* — Lin Li
(74) *Attorney, Agent, or Firm* — Fenwick & West LLP

(57) ABSTRACT

A display device with a reduced bezel area is disclosed. In one embodiment, the display device includes a cut-out region on which an electronic component is to be placed, and a display panel for displaying an image. The cut-out region extends from a first side toward a second side of the display device. The display panel includes a first display area between a third side of the display device and the cut-out region, a second display area between a fourth side of the display device and the cut-out region, and a third display area between the third side and the fourth side of the display device, the third display area disposed below the first display area, the second display area, and the cut-out region toward the second side of the display device.

15 Claims, 6 Drawing Sheets

(56) References Cited

U.S. PATENT DOCUMENTS

2016/0019856 A1\* 1/2016 Tanaka ................ G09G 3/3648
    345/206
2016/0240117 A1\* 8/2016 Xu ........................ G09G 3/003

\* cited by examiner

PANEL ARRAY FOR DISPLAY DEVICE WITH NARROW BEZEL

This application claims the benefit of Korean Patent Application No. 10-2014-0139938 filed on Oct. 16, 2014, which is incorporated herein by reference for all purposes as if fully set forth herein.

BACKGROUND

Technical Field

The disclosure relates to a display device and, particularly, to a panel array of a display device having a narrow bezel.

Discussion of the Related Art

A variety of electronic devices such as cellular phones, tablet PCs and notebook computers use a flat panel display (FPD).

Efforts to minimize the thickness of a display device have been made. Technology for narrowing the bezel of the display device is actively studied. That is, a narrow bezel technology for providing a wider image to users by increasing an image display area of a screen of the display device while minimizing the left and right edges of the screen, in which images are not displayed, is being actively researched.

The screen of a display device includes an effective display area AA in which an image is displayed and non-display areas BZ1 and BZ2 surrounding the effective display area AA, as shown in FIG. 1. When the display device is implemented in a cellular phone, a data driver for driving data lines is provided to the lower non-display area of the screen and various functional elements, for example, a receiver 1, various sensors 2, a front camera 3 and the like are can be implemented in the upper non-display area BZ2.

The narrow bezel technology cannot be applied to the area in which the data driver is mounted because of fixed standards for the data driver. To reduce the upper non-display area BZ2 of the screen, the functional elements may be eliminated or the positions thereof may be changed to the side or the backside of the display device. In this case, it may be difficult to execute functions of the functional elements. Thus, functional elements may be located in the upper non-display area, which may limit expansion of the effective display area.

SUMMARY

Embodiments relate to a display device with a reduced bezel. In one or more embodiments, the display device includes a cut-out region on which an electronic component is to be placed, and a display panel for displaying an image. The cut-out region extends from a first side of the display device toward a second side of the display device. The display panel includes a first display area between a third side of the display device and the cut-out region, each of first pixels of the first display area coupled to a corresponding one of a first set of gate lines, a second display area between a fourth side of the display device and the cut-out region, each of second pixels of the second display area coupled to a corresponding one of a second set of gate lines, and a third display area between the third side and the fourth side of the display device, each of third pixels of the third display area coupled to a corresponding one of a third set of gate lines, the third display area disposed below the first display area, the second display area, and the cut-out region toward the second side of the display device.

In one or more embodiments, the display panel further includes a first non-display area between the third side of the display device and the first and third display areas, a second non-display area between the fourth side of the display device and the second and third display areas, and a third non-display area between the first and second display areas and surrounding the cut-out region.

In one or more embodiments, the display panel further includes a first set of gate drivers in the first non-display area, each of the first set of gate drivers configured to drive a corresponding one of the first set of gate lines coupled to corresponding ones of the first pixels in the first display area, a second set of gate drivers in the third non-display area, each of the second set of gate drivers configured to drive a corresponding one of the second set of gate lines coupled to corresponding ones of the second pixels in the second display area; and a third set of gate drivers in the first non-display area, each of the third set of gate drivers configured to drive a corresponding one of the third set of gate lines coupled to corresponding ones of the third pixels in the third display area.

BRIEF DESCRIPTION OF THE DRAWINGS

The accompanying drawings, which are included to provide a further understanding of certain embodiments and are incorporated in and constitute a part of this application, illustrate embodiment(s) and together with the description serve to explain the principle of various embodiments.

DETAILED DESCRIPTION

Preferred embodiments will now be described with reference to FIGS. 2 through 8.

Figure 1:
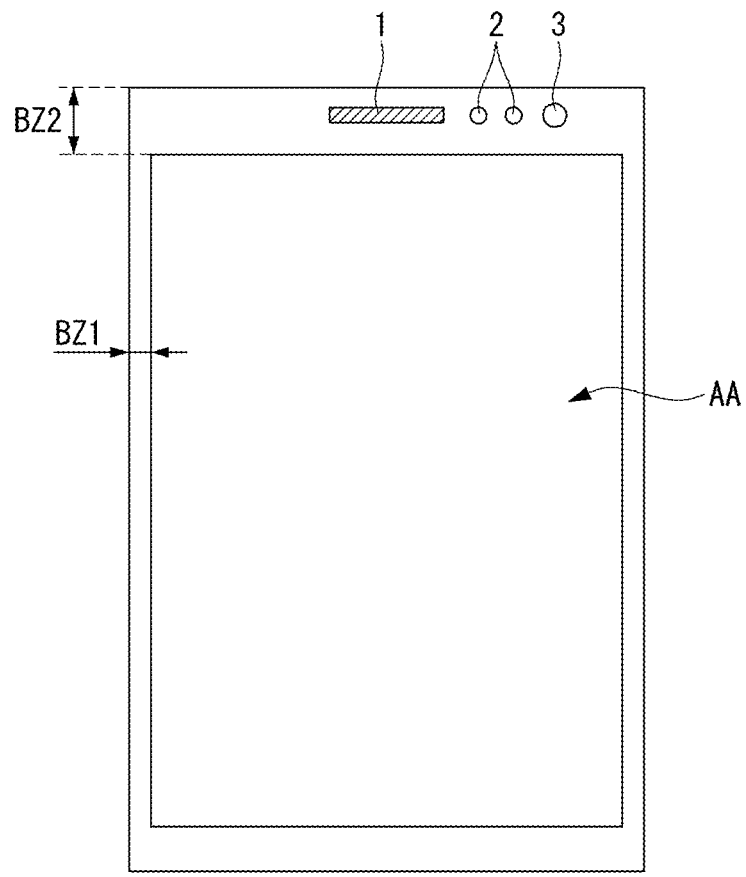
FIG. 1 illustrates a display screen to which the conventional narrow bezel technology is applied.
Figure 2:
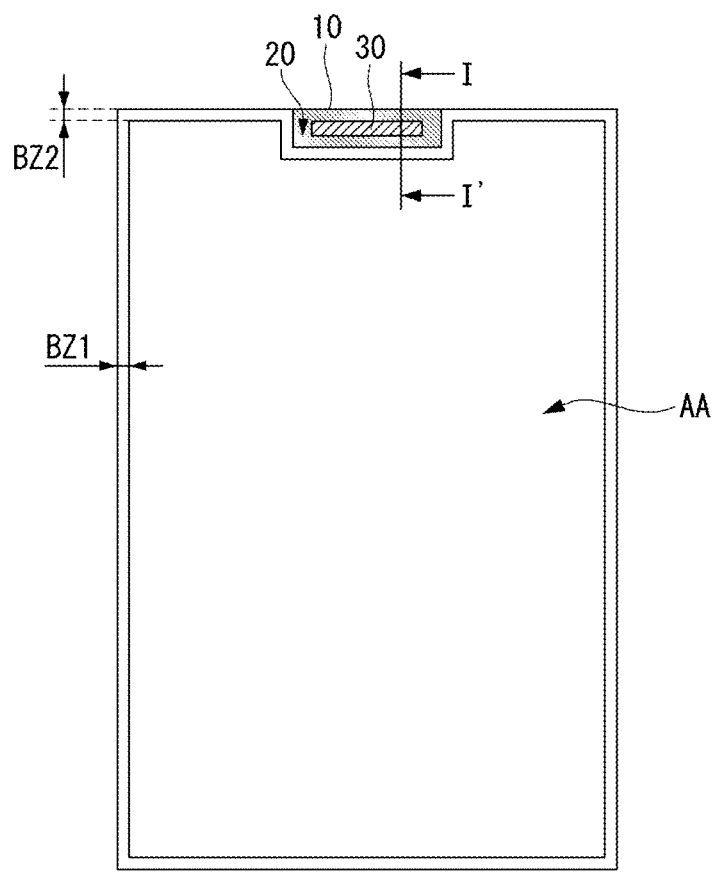
FIG. 2 illustrates a panel array for a display device, which can be configured to extend an effective display area, according to an embodiment.
Figure 3:
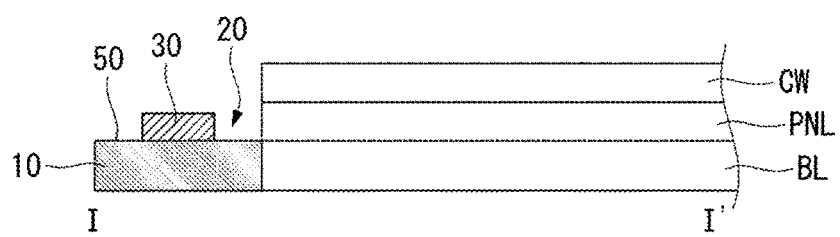
FIG. 3 is a cross-sectional view taken along line I-I' of FIG. 2.

FIG. 2 illustrates a panel array for a display device, which can have an extended effective display area according to an embodiment and FIG. 3 is a cross-sectional view taken along line I-I' of FIG. 2.

Referring to FIGS. 2 and 3, the panel array of the display device includes an effective display area AA and non-display areas BZ1 and BZ2 around the effective display area AA.

The display device may be implemented as one of a liquid crystal display (LCD), a plasma display panel (PDP), an organic electroluminescent display (OLED) and an electrophoretic display (EPD).

While the display device is implemented as an LCD as an example, the technical scope is not limited to the LCD and is applicable to various flat panel displays.

The display panel array may include a display panel PNL, a backlight unit BL and a cover window CW.

The display panel PNL includes two glass substrates and a liquid crystal layer LC formed therebetween. A plurality of data lines, a plurality of gate lines intersecting the data lines, and a common voltage supply line through which a common voltage is applied may be formed on the lower glass substrate of the display panel PNL. In addition, thin film transistors (TFTs) respectively formed at the intersections of the data lines and the gate lines, pixel electrodes for charging a data voltage in liquid crystal cells, and storage capacitors connected to the pixel electrodes to maintain the voltages of the liquid crystal cells may be formed on the lower glass substrate of the display panel PNL. The upper glass substrate of the display panel PNL may include a color filter array formed thereon. The color filter array may include a black matrix and a color filter. An upper polarization film is attached to the upper glass substrate, a lower polarization film is attached to the lower glass substrate, and an alignment film for setting a pretilt angle of liquid crystal are formed on inner surfaces of the upper and lower polarization films, which come into contact with the liquid crystal layer. A column space for maintaining a cell gap of the liquid crystal cells may be formed between the upper and lower glass substrates.

A common electrode may be formed on the upper glass substrate in a vertical field driven mode such as twisted nematic (TN) mode or vertical alignment (VA) mode. The common electrode may be formed along with pixel electrodes on the lower glass substrate in a horizontal field driven mode such as in-plane switching (IPS) mode or fringe field switching (FFS) mode.

Such display panel PNL can be implemented not only in the TN mode, VA mode, IPS mode or FFS mode but also in any liquid crystal mode. The display device may be implemented as any type of display device such as a backlit LCD, a transflective LCD and a reflective LCD. The backlight unit BL can be implemented in the backlit LCD and the transflective LCD. The backlight unit BL may be implemented as a direct type backlight unit or an edge type backlight unit.

The cover window CW is attached to the display panel PNL so as to protect the display panel PNL from external environmental conditions. The cover window CW is made of a transparent material so as to transmit display light input thereto from the display panel.

The panel array may include gate drivers symmetrically formed in the left and right non-display areas BZ1 in order to reduce left and right bezels of the display device. The gate drivers may be directly formed on the lower glass substrate of the display panel in a gate driver in panel (GIP) scheme. The gate driver is called a GIP circuit hereinafter. The GIP circuit drives the gate lines of the display panel by generating a scan pulse signal and supplying the scan pulse signal to the gate lines in a row sequential manner. The data lines of the display panel are driven by a data driver which may be mounted on part of the lower non-display area of the panel array.

The panel array may have an exposure groove 20 formed in part of the upper non-display area BZ2 of the screen of the display device in order to expand the effective display area AA to the upper part of the screen. FIG. 3 shows that the exposure groove 20 is exposed to the outside without being covered by the cover window CW. However, the exposure groove 20 may be covered by the cover window CW.

A non-display functional element 30 mounted on a cut-out region 50 of the panel array is inserted through the exposure groove 20. The non-display functional element 30 may be positioned on the cut-out region 50 on a support member 10 extended from the backlight unit BL. Here, the non-display functional element 30 refers to a functional element (or an electronic component) that executes any input or output function. The non-display functional element 30 may include, but not limited to, a status indicator (e.g., LED), a switch, a receiver, various sensor modules and a front camera.

The panel array can reduce the area of the screen occupied by the conventional non-display functional element by using the exposure groove 20. In addition, the effective display area is increased by the reduced non-display area and thus a larger screen can be provided. Accordingly, improved immersion experience can be provided to users.

Figure 4:
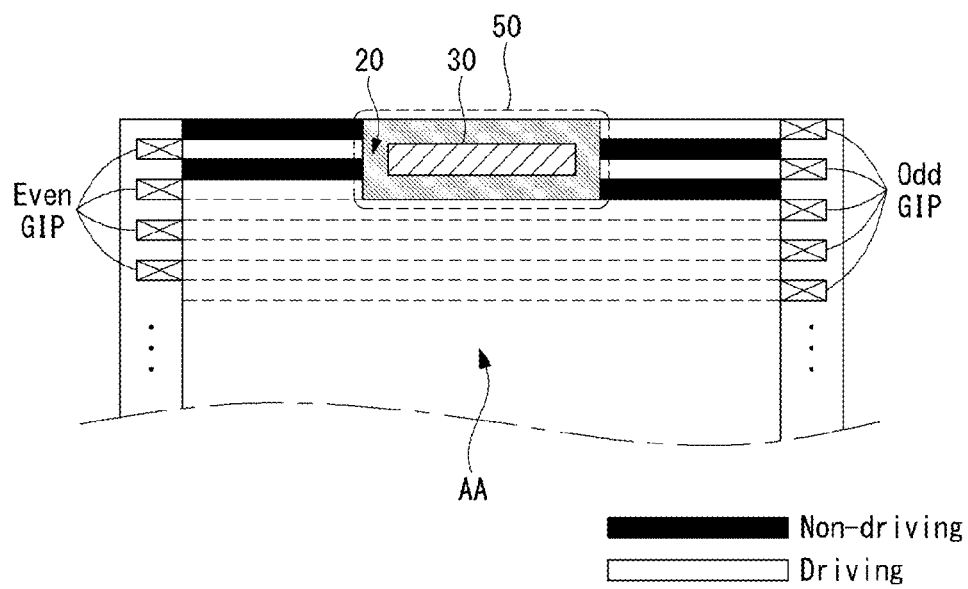
FIGS. 4 and 5 show a display screen where an upper effective display area is extended using an exposure groove.
Figure 5:
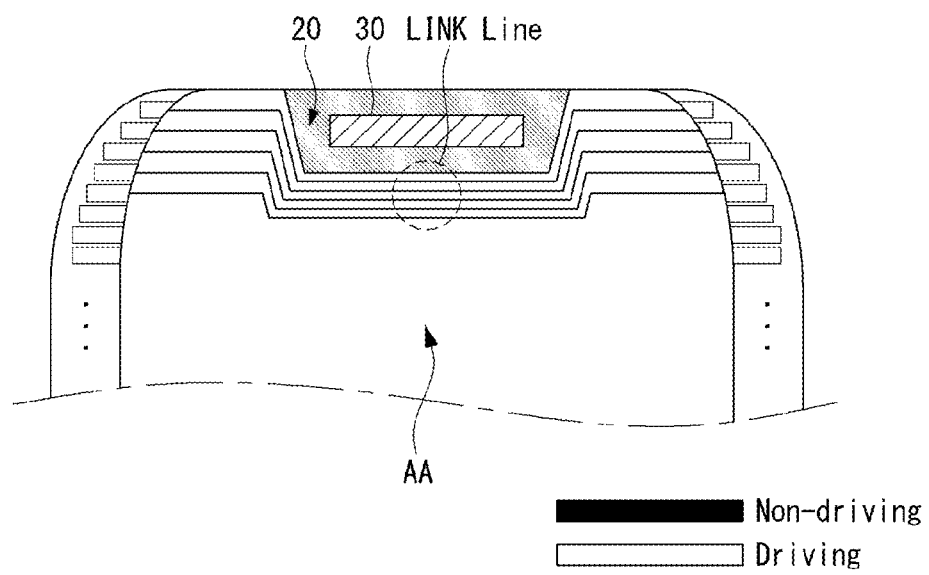

FIGS. 4 and 5 illustrate a display screen where the upper effective display area is extended using the exposure groove 20.

When the upper effective display area AA is extended using the exposure groove 20, the left and right effective display regions are arranged having the exposure groove 20 positioned therebetween at the upper part of the panel array.

As shown in FIG. 4, the GIP circuit may include odd GIP circuits formed at the right side (or left side) of the display screen in order to sequentially drive odd gate lines row by row and GIP circuits formed at the left side (or right side) of the display screen in order to sequentially drive even gate lines row by row.

Normal image display can be achieved only when the gate lines are normally driven in the entire area. However, during a scribing process for forming the exposure groove 20, gate lines horizontally extended to the left and right from the exposure groove 20 are cut due to the exposure groove 20. In this case, odd gate lines corresponding to the left effective display region near the exposure groove 20 are disconnected from the odd GIP circuits on the right side of the display screen and thus the odd gate lines corresponding to the left effective display region are not driven. Similarly, even gate lines corresponding to the right effective display region near the exposure groove 20 are disconnected from the even GIP circuits and thus the even gate lines corresponding to the right effective display region are not driven, as shown in FIG. 4.

In one aspect, additional gate link lines may be formed in a lower non-display region near the exposure groove 20 to connect, using the gate link lines, disconnected gate lines due to the exposure groove 20. However, dozens to hundreds of gate lines may be cut (or disconnected) due to the exposure groove 20. Since there is a limit in decreasing the size of the exposure groove 20 considering execution of the function of the non-display functional element 30, the number of disconnected gate lines increases as the resolution of the display panel increases and the number of required gate link lines also increases. When the number of gate link lines increases, the area of the lower non-display region near the exposure groove 20, which is occupied by the gate link lines, increases. Accordingly, it is difficult to extend the effective display area AA to the upper part of the display screen.

Figure 6:
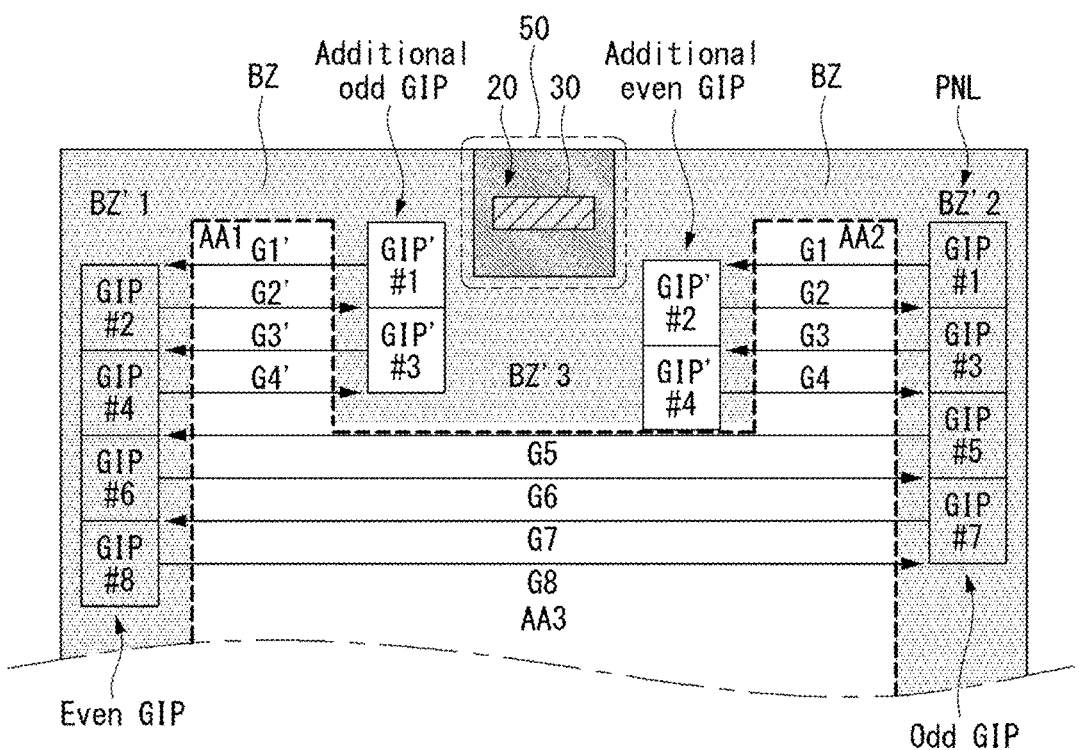
FIG. 6 illustrates a method for solving a gate line non-driving problem caused by the exposure groove.
Figure 7:
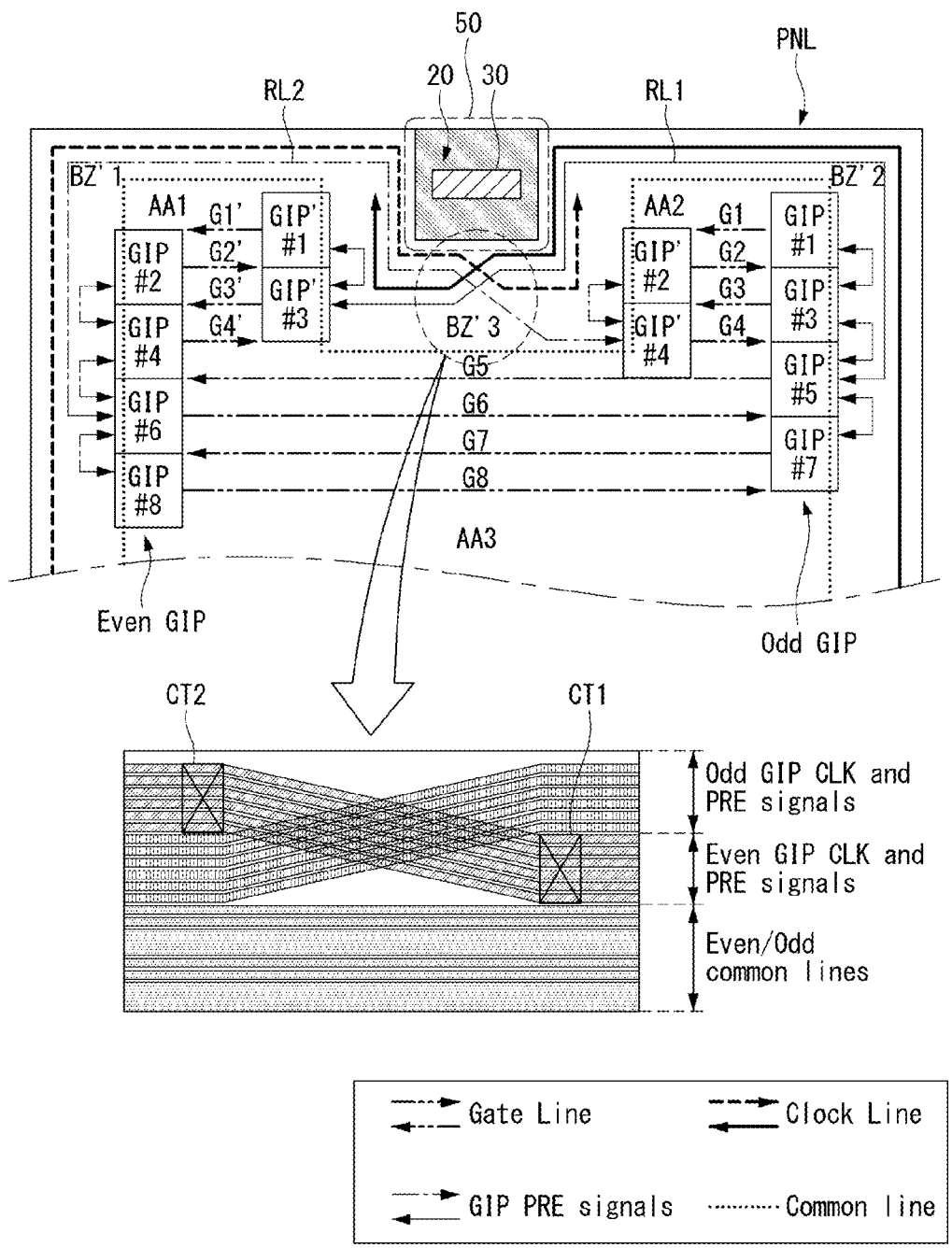
FIG. 7 illustrates an example of connection of GIP circuits in a GIP circuit configuration as shown in FIG. 6.
Figure 8:
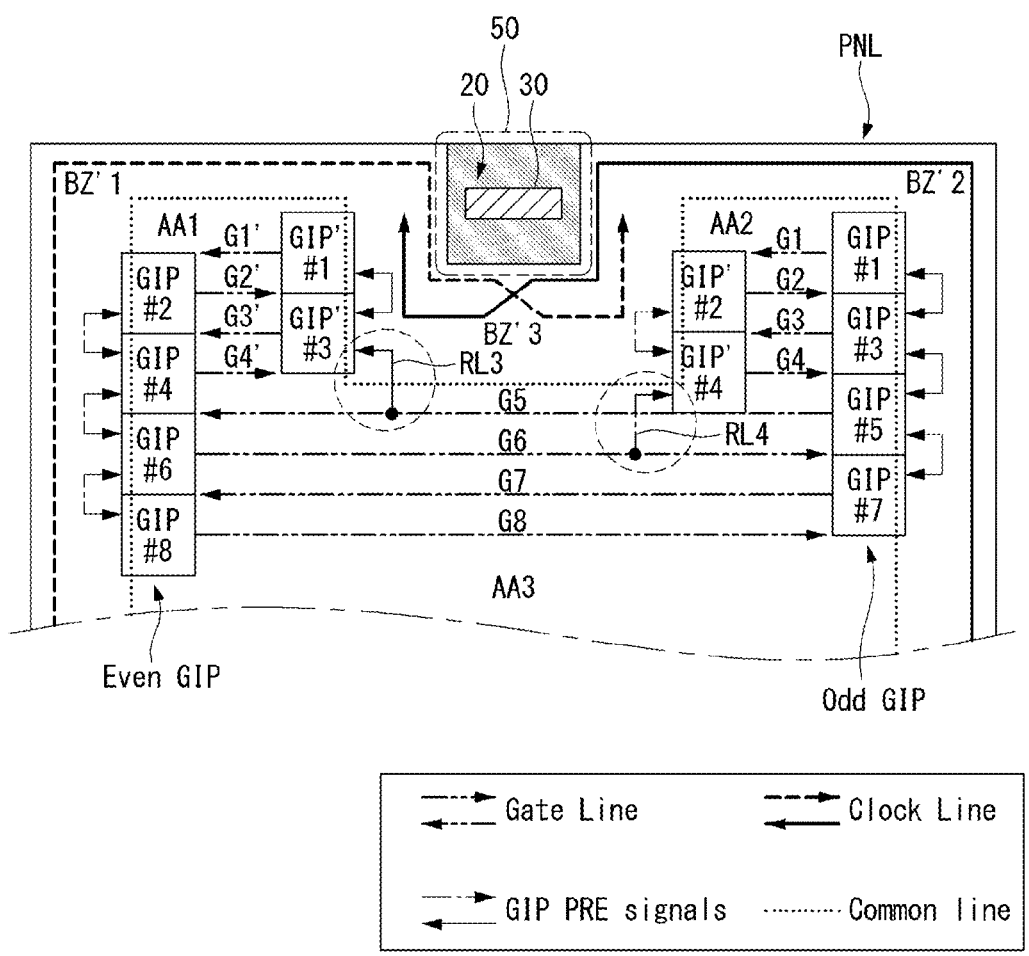
FIG. 8 illustrates another example of connection of GIP circuits in a GIP circuit configuration as shown in FIG. 6.

FIG. 6 illustrates a method for connecting disconnected gate lines due to the exposure groove 20 according to one embodiment. FIGS. 7 and 8 illustrate coupling of GIP circuits in the GIP circuit configuration shown in FIG. 6.

In FIG. 6, the display device (or a display array) includes a cut-out region 50 on which an electronic component is to be placed through the exposure groove 20. The cut-out region 50 extends from a top side of the display device toward a bottom side of the display device.

In addition, the display device (or the display array) includes a display panel PNL. The display panel PNL includes a first display area AA1 (herein also referred to as "a first display region AA1") between a left side of the display device and the cut-out region 50. Each of pixels of the first display area AA1 is coupled to a corresponding one of a first set of gate lines G1', G2', G3', and G4'. In addition, the display panel PNL includes a second display area AA2 (herein also referred to as "a second display region AA2") between a right side of the display device and the cut-out region 50. Each of pixels of the second display area AA2 is coupled to a corresponding one of a second set of gate lines G1, G2, G3, and G4. Furthermore, the display panel PNL includes a third display area AA3 (herein also referred to as "a third display region AA3") between the left side and the right side of the display device. The third display area AA3 is disposed below the first display area AA1, the second display area AA2, and the cut-out region 50 exposed through the exposure groove 20 toward the bottom side of the display device. Each of pixels of the third display area AA3 is coupled to a corresponding one of a third set of gate lines G5, G6, G7, and G8.

Moreover, the display panel PNL includes a non-display area. In one embodiment, the display panel PNL includes a first non-display area BZ'1 (herein also referred to as "a first non-display region BZ'1"), a second non-display area BZ'2 (herein also referred to as "a second non-display region BZ'2") and a third non-display area BZ'3 (herein also referred to as "a third non-display region BZ'3"). The first non-display area BZ'1 is disposed between the left side of the display device and the first display area AA1 and the third display area AA3. The second non-display area BZ'2 is disposed between the right side of the display device and the second display area AA2 and the third display area AA3. The third non-display area BZ'3 is disposed between the first and second display areas AA1, AA2 and surrounds the cut-out region 50.

The display panel PNL includes GIP circuits in the non-display area BZ'1 and BZ'2 to drive the gate lines. For example, even GIP circuits are included in the first non-display area BZ'1 to drive gate lines G2', G4', G6 and G8, and odd GIP circuits are included in the second non-display area BZ'2 to drive gate lines G1, G3, G5, and G7.

The display panel PNL also includes an additional even GIP circuit and an additional odd GIP circuit, which are formed in a non-display region BZ'3 near the exposure groove 20, to drive gate lines G1', G3', G2 and G4 in order to extend the effective display area AA.

In FIG. 6, the odd GIP circuit may be formed in the right non-display area BZ'2 of the display screen and sequentially drive odd gate lines row by row and the even GIP circuit may be formed in the left non-display area BZ'1 of the display screen and sequentially drive even gate lines row by row.

In this case, the additional odd GIP circuit is formed in a left non-display region BZ'3 near the exposure groove 20, facing the even GIP circuit, so as to sequentially drive odd gate lines G1' and G3', which cannot be coupled to the odd GIP circuit due to the exposure groove 20, row by row. In addition, the additional even GIP circuit is formed in a right non-display region BZ'3 near the exposure groove 20, facing the odd GIP circuit, so as to sequentially drive even gate lines G2 and G4, which cannot be coupled to the odd GIP circuit due to the exposure groove 20, row by row. While two odd gate lines and two even gate lines which cannot be coupled to the even/odd GIP circuits are described in the present embodiment, the number of odd/even gate lines may be any number (e.g., dozens to hundreds) of even gate lines or odd gate lines connected through additional GIPs.

The odd GIP circuit includes a plurality of odd GIP circuits GIP #1, GIP #3, GIP #5 and GIP #7 and the additional odd GIP circuit also includes a plurality of odd GIP circuits GIP' #1 and GIP' #3. Since the two odd GIP circuits GIP #1 and GIP' #1 or GIP #3 and GIP' #3, which are arranged in the horizontal direction, where the exposure groove 20 may be disposed therebetween, and drive the disconnected odd gate line G1-G1' or G3-G3' in the same row, are simultaneously driven, a driving scheme is simplified.

The even GIP circuit includes a plurality of even GIP circuits GIP #2, GIP #4, GIP #6 and GIP #8 and the additional even GIP circuit also includes a plurality of even GIP circuits GIP' #2 and GIP' #4. Since the two even GIP circuits GIP #2 and GIP' #2 or GIP #4 and GIP' #4, which are arranged in the horizontal direction, where the exposure groove 20 may be disposed therebetween, and drive the disconnected even gate line G2-G2' or G4-G4' in the same row, are simultaneously driven, a driving scheme is simplified.

Since the additional even GIP circuit and the additional odd GIP circuit are formed, a distance between an odd GIP circuit and an additional even GIP circuit or an even GIP circuit and an additional odd GIP circuit, facing each other having gate lines provided therebetween, is shorter in a region near the exposure groove 20 than a distance between an odd GIP circuit in the second non-display region BZ'2 and an even GIP circuit in the first non-display region BZ'1. Furthermore, the panel array does not employ gate link lines for connecting the disconnected gate lines due to the exposure groove 20.

For normal driving of disconnected gate lines (e.g. G1 through G4 or G1' through G4'), GIP circuits are connected. In one example, one (e.g., GIP #6) of the even GIP circuits has three ports, where a first port of the even GIP circuit is coupled to a corresponding even gate line (e.g., G6) in the third display region AA3, a second port of the even GIP circuit is coupled to an adjacent even GIP circuit (e.g., GIP #4) in the first non-display region BZ'1, and a third port of the even GIP circuit is coupled to one (e.g., GIP #4') of additional even GIP circuits in the third non-display region BZ'3. Similarly, one (e.g., GIP #5) of the odd GIP circuits has three ports, where a first port of the odd GIP circuit is coupled to a corresponding odd gate line (e.g., G5) in the third display region AA3, a second port of the odd GIP circuit is coupled to an adjacent odd GIP circuit (e.g., GIP #3) in the second non-display region BZ'2, and a third port of the odd GIP circuit is coupled to one of odd GIP circuits (e.g., GIP'#3) in the third non-display region BZ'3.

To this end, odd signal lines for connecting the odd GIP circuit and the additional odd GIP circuit and even signal lines for connecting the even GIP circuit and the additional even GIP circuit may be formed in a lower non-display region BZ'3 near the exposure groove 20, as shown in FIG. 7. In addition, common signal lines for commonly connecting the odd GIP circuit, the additional even GIP circuit, the additional odd GIP circuit and the even GIP circuit may be formed.

Here, the odd signal lines may include odd GIP clock signal lines for transmitting odd GIP clock signals Odd GIP CLK and odd GIP carry signal lines RL1 for transmitting a carry signal Odd GIP PRE between neighboring odd GIP circuits. The even signal lines may include even GIP clock signal lines for transmitting even GIP clock signals Even GIP CLK and even GIP carry signal lines RL2 for transmitting a carry signal Even GIP PRE between neighboring even GIP circuits. The common signal lines may include a first power line for transmitting a scan high voltage VGH of a gate pulse signal, a second power line for transmitting a scan low voltage VGL of the gate pulse signal, and a third power line for transmitting a ground voltage GND. The common signal lines may further include a fourth power line for transmitting the common voltage.

Since only the odd and even signal lines and the common signal lines are formed in the lower non-display region BZ'3 near the exposure groove 20, the upper bezel can be reduced more compared to the upper bezel when the gate link lines are implemented (refer to FIG. 5). In addition, the disconnected gate lines in the same row are simultaneously driven to properly display images.

The odd signal lines intersect the even signal lines having an insulating layer formed therebetween in the lower non-display region BZ'3 near the exposure groove 20, thereby preventing short-circuit therebetween.

FIG. 8 illustrates another example of signal connection between GIP circuits and disconnected gate lines (e.g., G1 through G4 or G1' through G4').

Referring to FIG. 8, odd signal lines for connecting the odd GIP circuit and the additional odd GIP circuit and even signal lines for connecting the even GIP circuit and the additional even GIP circuit may be formed in the lower non-display region BZ'3 near the exposure groove 20. In addition, common signal lines for commonly connecting the odd GIP circuit, the additional even GIP circuit, the additional odd GIP circuit and the even GIP circuit may be formed.

In the example of FIG. 8, the number of signal lines formed in the lower non-display region BZ'3 near the exposure groove 20 is reduced compared to that of the example of FIG. 7. To this end, odd GIP clock signal lines for transmitting odd GIP clock signals Odd GIP CLK, even GIP clock signal lines for transmitting even GIP clock signals Even GIP CLK and the common signal lines are formed in the lower non-display region BZ'3 near the exposure groove 20, and odd GIP carry signal lines for transmitting a carry signal Odd GIP PRE between neighboring odd GIP circuits and even GIP carry signal lines for transmitting a carry signal Even GIP PRE between neighboring even GIP circuits are not formed therein.

Since the odd and even signal lines and the common signal lines are formed in the lower non-display area BZ'3 near the exposure groove 20 without the odd GIP carry signal lines and the even GIP carry signal lines, the example of FIG. 8 is more effective to reduce the upper bezel than the example using gate link lines (refer to FIG. 5) and the example of FIG. 7. In addition, disconnected gate lines in the same row are simultaneously driven, thus image can be displayed successfully in the display areas AA1 and AA2.

In the example of FIG. 8, the additional odd GIP circuit is directly connected to odd gate lines driven by the odd GIP circuit, instead of directly being coupled to the odd GIP circuit to receive a carry signal, and thus the length of the odd GIP carry signal lines can be reduced so as to remarkably decrease RC delay. In addition, the additional even GIP circuit is directly connected to even gate lines driven by the even GIP circuit, instead of directly being coupled to the even GIP circuit to receive a carry signal, and thus the length of the even GIP carry signal lines can be reduced so as to remarkably decrease RC delay.

The additional odd GIP circuit GIP' #3 among the additional odd GIP circuits GIP' #1 and GIP' #3 may be directly connected to a gate line G5 among the odd gate lines G5 and G7, so as to receive a gate pulse signal from the connected odd gate line G5 as a carry signal.

The additional even GIP circuit GIP' #4 among the additional even GIP circuits GIP' #2 and GIP' #4 may be directly connected to a gate line G6 among the even gate lines G6 and G8 so as to receive a gate pulse signal from the connected odd gate line G6 as a carry signal.

Particularly, the additional odd GIP circuit GIP' #3 closest to a bottom side of the display device among the additional odd GIP circuits GIP' #1 and GIP' #3 is coupled to the odd gate line G5 closest to the top side of the display device among the odd gate lines G5 and G7 through a first connection line RL3. Similarly, the additional even GIP circuit GIP' #4 closest to the bottom side of the display device among the additional even GIP circuits GIP' #2 and GIP' #4 is coupled to the even gate line G6 closest to the top side of the display device among the even gate lines G6 and G8 through a second connection line RL4. Accordingly, the lengths of the first and second connection lines RL3 and RL4 can be effectively reduced.

As described above, the effective display area can be extended by forming an exposure groove into which a non-display functional element is inserted at the upper part of the display screen on the cut-out region 50 and simultaneously driving gate lines which have been disconnected due to the exposure groove by forming additional GIP circuits in a non-display area near the exposure groove, thereby achieving normal image display.

Those skilled in the art will appreciate that various embodiments may be implemented in other ways than those set forth herein. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A display device including a display panel, the display device comprising:
　a cut-out region on which an electronic component is to be placed, the cut-out region being disposed outside the display panel and extending from a first side of the display device toward a second side of the display device; and
　the display panel including:
　　a first display area between a third side of the display device and the cut-out region, the first display area including a first subset of rows and a second subset of rows;
　　a second display area between a fourth side of the display device and the cut-out region, the second display area including a third subset of rows and a fourth subset of rows;
　　a third display area between the third side and the fourth side of the display device, the third display area including a fifth subset of rows and a sixth subset of rows, the third display area disposed below the first display area, the second display area, and the cut-out region toward the second side of the display device;
　　a first set of gate drivers disposed between the third side of the display device and the first display area, the first set of gate drivers coupled to the first subset of rows of the first display area;
　　a second set of gate drivers disposed between the first display area and the cut-out region, the second set of gate drivers coupled to the second subset of rows of the first display area;
　　a third set of gate drivers disposed between the fourth side of the display device and the second display area, the third set of gate drivers coupled to the third subset of rows of the second display area; and a fourth set of gate drivers disposed between the second display area and the cut-out region, the fourth set of gate drivers coupled to the fourth subset of rows of the second display area.

2. The display device of claim 1, wherein the display panel further includes:

a first non-display area between the third side of the display device and the first and third display areas;

a second non-display area between the fourth side of the display device and the second and third display areas; and a third non-display area between the first and second display areas and surrounding the cut-out region.

3. The display device of claim 1, wherein the first subset of rows and the second subset of rows of the first display area alternate with each other.

4. The display device of claim 1, wherein the display panel further includes:

a fifth set of gate drivers disposed between the first side of the display device and the third display area, coupled to the fifth subset of rows of the third display area; and a sixth set of gate drivers disposed between the third display area and the fourth side of the display device, the sixth set of gate drivers coupled to the sixth subset of rows of the third display area.

5. The display device of claim 4, wherein one of the fifth set of gate drivers is configured to transmit a gate pulse signal to one of the first set of gate drivers and one of the fourth set of gate drivers.

6. The display device of claim 5, wherein one of the sixth set of gate drivers is configured to transmit another gate pulse signal to one of the third set of gate drivers and one of the second set of gate drivers.

7. The display device of claim 5, wherein the one of the fifth set of gate drivers includes a first port, a second port, and a third port, the first port coupled to a corresponding one of the fifth subset of rows, the second port coupled to the one of the first set of gate drivers, and the third port coupled to the one of the fourth set of gate drivers.

8. The display device of claim 7, wherein one of the sixth set of gate drivers is configured to transmit another gate pulse signal to one of the third set of gate drivers and one of the second set of gate drivers, and wherein the one of the sixth set of gate drivers includes a fourth port, a fifth port, and a sixth port, the fourth port coupled to a corresponding one of the sixth subset of rows, the fifth port coupled to the one of the third set of gate drivers, and the sixth port coupled to the one of the second set of gate drivers.

9. The display device of claim 5, wherein the one of the fourth set of gate drivers is directly connected to a gate line of the fifth subset of rows driven by the one of the fifth set of gate drivers.

10. The display device of claim 9, wherein one of the sixth set of gate drivers is configured to transmit another gate pulse signal to one of the third set of gate drivers and one of the second set of gate drivers, and wherein the one of the second set of gate drivers is directly connected to a gate line of the sixth subset of rows driven by the one of the sixth set of gate drivers.

11. The display device of claim 9, wherein the one of the fourth set of gate drivers is closest to the second side of the display device among the fourth set of gate drivers, and the gate line of the fifth subset of rows is closest to the first side of the display device among the fifth subset of rows.

12. The display device of claim 11, wherein one of the second set of gate drivers closest to the second side of the display device among the second set of gate drivers is directly connected to a gate line of the sixth subset of rows closest to the first side of the display device among the sixth subset of rows.

13. The display device of claim 4, further comprising:

a first signal line extending from the first non-display area to the third non-display area, the first signal line to provide a first clock signal to the first, fourth, and fifth set of gate drivers; and a second signal line extending from the second non-display area to the third non-display area, the second signal line to provide a second clock signal to the second, third, and sixth set of gate drivers.

14. The display device of claim 13, further comprising an insulating layer between the first signal line and the second signal line in a portion of the third non-display area in which the first signal line and the second signal line cross each other.

15. The display device of claim 1, wherein the third subset of rows and the fourth subset of rows alternate with each other.

* * * * *